United States Patent
Horiuchi

(10) Patent No.: US 9,219,176 B2
(45) Date of Patent: Dec. 22, 2015

(54) RADIAL RAY DETECTOR AND METHOD FOR MANUFACTURING THE SAME

(75) Inventor: Hiroshi Horiuchi, Otawara (JP)

(73) Assignees: KABUSHIKI KAISHA TOSHIBA, Tokyo (JP); TOSHIBA ELECTRON TUBES & DEVICES CO., LTD., Tochigi-Ken (JP)

( * ) Notice: Subject to any disclaimer, the term of this patent is extended or adjusted under 35 U.S.C. 154(b) by 987 days.

(21) Appl. No.: 12/266,185

(22) Filed: Nov. 6, 2008

(65) Prior Publication Data

US 2009/0050817 A1 Feb. 26, 2009

Related U.S. Application Data

(63) Continuation of application No. PCT/JP2007/059617, filed on May 9, 2007.

(30) Foreign Application Priority Data

May 9, 2006 (JP) ................................. 2006-130406

(51) Int. Cl.
*G01T 1/20* (2006.01)
*H01L 31/0232* (2014.01)
*H01L 31/09* (2006.01)
H01L 27/146 (2006.01)
H04N 5/32 (2006.01)

(52) U.S. Cl.
CPC ............ *H01L 31/02322* (2013.01); *G01T 1/20* (2013.01); *H01L 31/09* (2013.01); *H01L 27/14663* (2013.01); *H04N 5/32* (2013.01)

(58) Field of Classification Search
CPC ........... G01T 1/20; G01T 1/202; G01T 1/208; G01T 1/24
USPC ..................................................... 250/370.11
See application file for complete search history.

(56) References Cited

U.S. PATENT DOCUMENTS

| | | | | |
|---|---|---|---|---|
| 4,947,412 | A | * | 8/1990 | Mattson .......................... 378/19 |
| 5,434,418 | A | | 7/1995 | Schick |
| 6,583,419 | B1 | * | 6/2003 | Moy et al. ................ 250/370.11 |
| 2003/0107001 | A1 | * | 6/2003 | Baumgartner et al. .. 250/370.11 |
| 2003/0116716 | A1 | * | 6/2003 | Homme et al. .......... 250/370.11 |
| 2003/0173493 | A1 | * | 9/2003 | Homme et al. ............... 250/200 |
| 2005/0092927 | A1 | * | 5/2005 | Nagano ..................... 250/370.11 |

FOREIGN PATENT DOCUMENTS

| | | |
|---|---|---|
| JP | 2001-188086 | 7/2001 |
| JP | 2002-048872 | 2/2002 |

(Continued)

*Primary Examiner* — Marcus Taningco
(74) *Attorney, Agent, or Firm* — Pillsbury Winthrop Shaw Pittman, LLP

(57) ABSTRACT

A light receiving section and a substrate-side electrode pad of a photoelectric conversion substrate, a base-side electrode pad and an interconnect arranged on a surface side of a base are integrally coated with a protective layer. A scintillation layer is formed on a surface side of the protective layer. Corrosion of a photoelectric conversion element of the light receiving section, the electrode pads and the interconnect is prevented by the protective layer. When they are integrally coated with the protective layer, the light receiving section and the substrate-side electrode pad of the photoelectric conversion substrate can be arranged with a distance therebetween shortened, thereby realizing miniaturization of a detector and enlargement of the light receiving section.

10 Claims, 2 Drawing Sheets

(56) References Cited

FOREIGN PATENT DOCUMENTS

| | | |
|---|---|---|
| JP | 2002-524841 | 8/2002 |
| JP | 2004-264239 | 9/2004 |
| JP | 2004-335870 | 11/2004 |
| JP | 2006-058124 | 3/2006 |
| JP | 2006-078471 | 3/2006 |

* cited by examiner

RADIAL RAY DETECTOR AND METHOD FOR MANUFACTURING THE SAME

CROSS-REFERENCE TO RELATED APPLICATIONS

This is a Continuation Application of PCT Application No. PCT/JP2007/059617, filed May 9, 2007, which was published under PCT Article 21(2) in Japanese.

This application is based upon and claims the benefit of priority from prior Japanese Patent Application No. 2006-130406, filed May 9, 2006, the entire contents of which are incorporated herein by reference.

BACKGROUND OF THE INVENTION

1. Field of the Invention

The present invention relates to an indirect radial ray detector and a method for manufacturing the same.

2. Description of the Related Art

As new-generation image detectors for X-ray diagnosis, an attention has been paid to planar-shaped X-ray detectors using an active matrix or a solid-state image sensing device such as CCD or CMOS. When such X-ray detectors are irradiated with X-rays, X-ray photographed images or real-time X-ray images are output as digital signals. Since the X-ray detectors are solid-state detectors, they are greatly expected from viewpoints of image quality performance and stability, and thus considerable research and development are being promoted.

The X-ray detectors using active matrix are developed mainly for photographing chest regions to collect still images with comparatively large radiation dosage and general photographing, and have been commodified in recent years. The commodification of the X-ray detectors are assumed in the near feature in order to apply them to the fields of circulatory organs and digestive organs in which real-time moving images of not less than 30 frames per second at transmitted ray amount should be realized with higher performance. In the application to the moving images, improvement of the signal-to-noise ratio and a real-time processing technique for very small signals become important terms of the development.

The X-ray detectors using solid-state image sensing device such as CCD or CMOS have been commodified in recent years for nondestructive inspection in the industrial field where still images are collected at large radiation dosage or dentistry where the detectors are put into mouth capsules and still images are collected. In such X-ray detectors, the improvement of the signal-to-noise ratio and the real-time process for very small signals, miniaturization of the X-ray detectors, and improvement of reliability as well as the application to moving images are important terms of the development.

The X-ray detectors are roughly classified into two systems including a direct system and an indirect system. The direct system is a system which converts X-rays directly into a charge signal by means of a photoconductive film made of a-Se or the like. On the other hand, the indirect system is a system which once converts X-rays into visible light by means of a scintillation layer and then converts the visible light into a signal charge by means of an a-Si photodiode, CCD or CMOS.

In the conventional indirect X-ray detectors, as shown in FIG. 4, a light receiving section 2 having a plurality of photoelectric conversion elements 2a for converting visible light into an electric signal is formed on a photoelectric conversion substrate 1, and substrate-side electrode pads 3 which are electrically connected to the photoelectric conversion elements 2a, respectively, are formed outside the light receiving section 2. A scintillation layer 4 which converts X-rays into visible light is formed on the light receiving section 2 of the photoelectric conversion substrate 1, and a reflection layer 5 which heightens use efficiency of the converted visible light is formed on the scintillation layer 4.

The photoelectric conversion substrate 1 is fixed onto a base 7 having base-side electrode pads 6 for external connection, and the substrate-side electrode pads 3 and the base-side electrode pads 6 are electrically connected by interconnects 8. The substrate-side electrode pads 3, the base-side electrode pads 6 and the interconnects 8 are coated with a protective layer 9 composed mainly of a resin material in order to achieve reliability of the X-ray detectors. In order to protect the scintillation layer 4, the surfaces of the scintillation layer 4 and the reflection layer 5 are coated with a protective layer, not shown, and a protective cover, not shown, is provided to an opening of the base 7 so that the inside of the base 7 is sealed.

Normally, in the indirect X-ray detectors, the property of the scintillation layer is structurally important, and high-luminance fluorescent materials composed of a halogen compound such as CsI or an oxide compound such as GOS are mostly used as the scintillation layer in order to improve output signal intensity with respect to incident X-ray. Further, in general, a high-density scintillation layer is often formed uniformly on a photoelectric conversion substrate according to a vapor growth method such as a vacuum deposition method, a sputtering method and a CVD method.

However, when the halogen compound such as CsI as the high-luminance fluorescent material is used for the scintillation layer, reactivity of a halogen element such as iodine is high, and thus the scintillation layer reacts with electropositive elements in the photoelectric conversion elements, the substrate-side electrode pads, the base-side electrode pads and the interconnects for electrically connecting these pads in contact with the scintillation layer. As a result, the photoelectric conversion elements and the like are corroded, and thus various properties and reliability of the X-ray detectors deteriorate.

As shown in FIG. 4, the substrate-side electrode pads 3, the base-side electrode pads 6 and the interconnects 8 for electrically connecting these pads 3 and 6 are coated with the protective layer 9, so that the corrosion can be prevented. Since the protective layer 9 is made mainly of a resin material, its X-ray absorptance is lower than that of the scintillation layer 4, and thus the reliability might deteriorate as a result of X-ray resistance.

On the other hand, as to the photoelectric conversion elements, although the indirect X-ray detectors reduces interlayer peeling of the scintillation layer, a transparent layer made of polyimide or the like is formed on the surface of the light receiving section of the photoelectric conversion substrate, and the scintillation layer is formed on the transparent layer so that the corrosion can be prevented (for example, see page 3 and FIG. 1 in Jpn. Pat. Appln. KOKAI Publication No. 2001-188086).

BRIEF SUMMARY OF THE INVENTION

As mentioned above, when the scintillation layer is formed on the surface of the light receiving section of the photoelectric conversion substrate via the transparent layer, and the substrate-side electrode pads, the base-side electrode pads and the interconnects for electrically connecting these pads are coated with the protective layer, the corrosion of the photoelectric conversion elements which contact the scintillation layer, the substrate-side electrode pads, the base-side electrode pads and the interconnects for electrically connecting these pads can be prevented.

As shown in FIG. 4, however, when the substrate-side electrode pads 3, the base-side electrode pads 6 and the interconnects 8 for electrically connecting the pads 3 and 6 are coated with the protective layer 9, a clearance should be secured for forming the protective layer 9 between the light receiving section 2 formed with the scintillation layer 4 and the substrate-side electrode pads 3 at the time of forming the protective layer 9. This poses obstacles to the miniaturization of the X-ray detectors and the enlargement of the light receiving section 2.

The present invention has been devised in view of the above points, and its object is to provide a radial ray detector which protects a photoelectric conversion element, electrode pads and interconnects, and can be miniaturized or can enlarge a light receiving section, and a method for manufacturing the same.

A radial ray detector of the present invention comprises a photoelectric conversion substrate which is provided with a light receiving section having a photoelectric conversion element on its surface side and a substrate-side electrode pad electrically connected to the photoelectric conversion element on an outer side of the light receiving section; a base where the photoelectric conversion substrate is arranged on its surface side and a base-side electrode pad electrically connected to the substrate-side electrode pad of the photoelectric conversion substrate is arranged; an interconnect which electrically connects the substrate-side electrode pad of the photoelectric conversion substrate and the base-side electrode pad of the base; a protective layer which integrally coats at least the light receiving section and the substrate-side electrode pad of the photoelectric conversion substrate, the base-side electrode pad and the interconnect arranged on the surface side of the base; and a scintillation layer formed on a surface side of the protective layer.

Also, a method for manufacturing a radial ray detector of the present invention comprises arranging, on a surface side of a base, a photoelectric conversion substrate provided with a light receiving section having a photoelectric conversion element on its surface side and a substrate-side electrode pad electrically connected to the photoelectric conversion element on an outer side of the light receiving section;

electrically connecting the substrate-side electrode pad of the photoelectric conversion substrate with a base-side electrode pad arranged on the surface side of the base by an interconnect;

integrally coating at least the light receiving section and the substrate-side electrode pad of the photoelectric conversion substrate, the base-side electrode pad and the interconnect arranged on the surface side of the base with a protective layer; and forming a scintillation layer on a surface side of the protective layer.

DETAILED DESCRIPTION OF THE INVENTION

Embodiments of the present invention will be described below with reference to the drawings.

Figure 1:
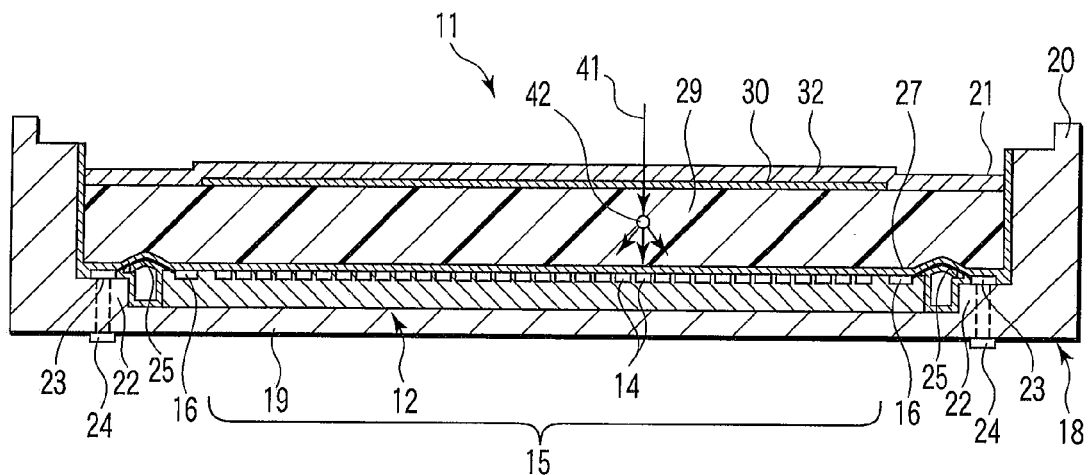
FIG. 1 is a cross-sectional view illustrating a radial ray detector according a first embodiment of the present invention.

FIG. 1 illustrates a first embodiment.

11 denotes an X-ray detector as a radial ray detector, and the X-ray detector 11 is an X-ray planar image detector of an indirect system. The X-ray detector 11 has a photoelectric conversion substrate 12 as an active matrix photoelectric conversion substrate for converting visible light into an electric signal.

A light receiving section 15, in which a plurality of photoelectric conversion elements 14 such as photodiodes for converting visible light into an electric signal are arranged towdimensionally into a matrix pattern, is formed on a center region of the surface of the photoelectric conversion substrate 12. A plurality of substrate-side electrode pads 16, which are electrically connected to the photoelectric conversion elements 14, respectively, and take out electric signals converted by the photoelectric conversion elements 14, are arranged on a peripheral edge of the surface of the photoelectric conversion substrate 12.

The X-ray detector 11 is provided with a base 18 to which the photoelectric conversion substrate 12 is fixed. The base 18 has a rectangular flat plate-shaped substrate arranged portion 19 and a peripheral wall portion 20 which protrudes from the peripheral edge portion of the substrate arranged portion 19 towards the surface side, and a concave portion 21 which is opened to the surface side of the base 18 is formed. The photoelectric conversion substrate 12 is arranged on and fixed to the center region of the substrate arranged portion 19 in the concave portion 21.

A protrusion 22 which protrudes to a position equivalent to the surface side of the photoelectric conversion substrate 12 is formed on a peripheral region of the substrate arranged portion 19 in the concave portion 21. A plurality of base-side electrode pads 23 which are electrically connected to the substrate-side electrode pads 16 of the photoelectric conversion substrate 12, respectively, are arranged on the surface side of the protrusion 22, and a plurality of electrode terminals 24 for external connection which are electrically connected to the base-side electrode pads 23, respectively, are arranged from the protrusion 22 to a rear side as an external surface of the base 18.

The substrate-side electrode pads 16 of the photoelectric conversion substrate 12 and the base-side electrode pads 23 of the base 18 are electrically connected by a plurality of interconnects 25 such as wires.

A protective layer 27 is formed on an entire inner surface of the concave portion 21 of the base 18 including the light receiving section 15 and the substrate-side electrode pads 16 of the photoelectric conversion substrate 12, the base-side electrode pads 23 and the interconnects 25 arranged on the surface side of the base 18 so as to continuously and integrally coat them. This protective layer 27 is a substance having an insulation property, a vapor barrier property, a permeation property with respect to light emission of a scintillation layer 29 and corrosion resistance to a substance composing the scintillation layer 29, and an organic substance mainly containing poly-paraxylylene or an inorganic substance mainly containing diamond crystal is used. Since the formation of the protective layer 27 requires continuous formation of a coating film on a convex-concave portion and a stepped portion of the photoelectric conversion substrate 12 and the concave portion 21 of the base 18, the vapor growth method such as the vacuum deposition method, the sputtering method and the CVD method, and the plating method are used. Particularly the CVD method at a low temperature which provides high shape consistency and enables a coating film to be formed also on the rear side of the interconnect 25 is preferably used.

The scintillation layer 29 which converts X-rays into visible light is formed on the concave portion 21 of the base 18 including the front side of the protective layer 27 on the photoelectric conversion substrate 12. The scintillation layer 29 is formed in such a manner that a fluorescence substance including a halogen compound such as cesium iodide (CsI) and an oxide compound such as gadolinium oxide sulfate (GOS) as high-luminance fluorescent substance is formed on the photoelectric conversion substrate 12 by the vapor growth method such as the vacuum deposition method, the sputtering method and the CVD method.

A reflecting layer 30 is formed on the surface of the scintillation layer 29 corresponding to the region of the light receiving section 15 on the photoelectric conversion substrate 12 so as to heighten the use efficiency of the visible light converted by the scintillation layer 29.

A protective layer 32 is formed by the substance and the method similar to the protective layer 27 so as to cover the surfaces of the scintillation layer 29 and the reflecting layer 30.

A function of this embodiment will be described below.

X-rays 41 incident on the scintillation layer 29 of the X-ray detector 11 are converted into visible light 42 by the scintillation layer 29.

The visible light 42 reaches the photoelectric conversion elements 14 of the light receiving section 15 of the photoelectric conversion substrate 12 via the scintillation layer 29 so as to be converted into an electric signal. The electric signal converted by the photoelectric conversion elements 14 is output to the outside via the substrate-side electrode pads 16, the interconnects 25, the base-side electrode pads 23 and the electrode terminals 24 by a reading operation.

A method for manufacturing the X-ray detector 11 will be described below.

The photoelectric conversion substrate 12 is arranged and fixed to the substrate arranged portion 19 in the concave portion 21 of the base 18, and the substrate-side electrode pads 16 of the photoelectric conversion substrate 12 and the base-side electrode pads 23 of the base 18 are electrically connected by the plurality of interconnects 25.

The protective layer 27 is formed on at least the entire inner surface of the concave portion 21 of the base 18 including the light receiving section 15 and the substrate-side electrode pads 16 of the photoelectric conversion substrate 12, the base-side electrode pads 23 and the interconnects 25 arranged on the surface side of the base 18 by the CVD method at low temperature, for example, so as to coat them continuously and integrally.

The scintillation layer 29 is formed on the concave portion 21 of the base 18 including the surface side of the protective layer 27 on the photoelectric conversion substrate 12, and the reflecting layer 30 and the protective layer 32 are formed sequentially on the surface side of the scintillation layer 29.

In the X-ray detector 11 having such a configuration, since at least the light receiving section 15 and the substrate-side electrode pads 16 of the photoelectric conversion substrate 12, the base-side electrode pads 23 and the interconnects 25 arranged on the surface side of the base 18 are coated with the protective layer 27 continuously and integrally, the protective layer 27 prevents the scintillation layer 29 from directly contacting with the photoelectric conversion elements 14 of the light receiving section 15, the electrode pads 16 and 23 and the interconnects 25. Even if the halogen compound such as CsI as the high-luminance fluorescent substance is used for the scintillation layer 29, the corrosion of the photoelectric conversion elements 14 of the light receiving section 15, the electrodes pads 16 and 23 and the interconnects 25 can be reliably prevented, thereby improving reliability of the X-ray detector 11. For this reason, the scintillation layer 29 can be formed on the light receiving section 15 and the substrate-side electrode pads 16 of the photoelectric conversion substrate 12, the base-side electrode pads 23 and the interconnects 25, so that productivity of the X-ray detector 11 can be improved and the production cost thereof can be reduced.

Since the light receiving section 15 and the substrate-side electrode pads 16 of the photoelectric conversion substrate 12, the base-side electrode pads 23 and the interconnects 25 arranged on the surface side of the base 18 are coated with the protective layer 27 continuously and integrally, the light receiving section 15 of the photoelectric conversion substrate 12 and the substrate-side electrode pads 16 can be arranged with a distance therebetween shortened, so that the X-ray detector can be miniaturized or the light receiving section 15 can be enlarged in outline size.

Since the protective layer 27 is formed on the surface side of the photoelectric conversion substrate 12, flatness of the surface side of the photoelectric conversion substrate 12 and a repair property of the scintillation layer 29 can be improved, and thus the scintillation layer 29 comes into contact with the photoelectric conversion substrate 12 via the protective layer 27. For this reason, a stress due to a difference in thermal expansion coefficient between the photoelectric conversion substrate 12 and the scintillation layer 29 can be reduced.

For example, CCD is used as the image pickup device of the photoelectric conversion substrate 12, Al is used as the material of the substrate-side electrode pads 16 on the photoelectric conversion substrate 12, ceramic is used as the material of the base 18, Au is used as the material of the base-side electrode pads 23 on the base 18, Au is used as the material of the interconnects 25 electrically connecting the substrate-side electrode pads 16 of the photoelectric conversion substrate 12 and the base-side electrode pads 23 of the base 18, polyparaxylylene is used as the composing substance of the protective layer 27, the CVD method is used as the method for forming the protective layer 27, the film thickness of the protective layer 27 is set to 1 µm, and CsI (TI dope) is used as the high-luminance fluorescent substance of the scintillation layer 29. As a result, at least the light receiving section 15 and the substrate-side electrode pads 16 of the photoelectric conversion substrate 12, the base-side electrode pads 23 and the interconnects 25 arranged on the surface side of the base 18 are coated with the protective layer 27 continuously and integrally, and the scintillation layer 29 does not directly contact the photoelectric conversion elements 14 of the light receiving section 15, the electrode pads 16 and 23 and the interconnects 25. For this reason, the reliability, the miniaturization and the productivity of the X-ray detector 11 can be improved and the production cost thereof can be reduced.

Figure 2:
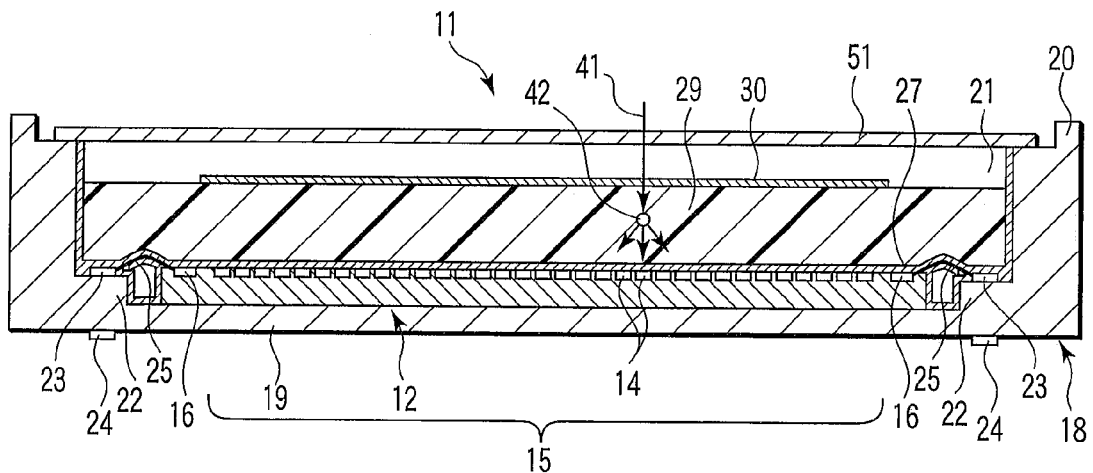
FIG. 2 is a cross-sectional view illustrating a radial ray detector according to a second embodiment of the present invention.

As shown in a second embodiment of FIG. 2, instead of the protective layer 32 of the X-ray detector 11 in the first embodiment, a protective cover 51 which blocks the opening of the concave portion 21 of the base 18 is provided and the concave portion 21 is sealed so that the scintillation layer 29 can be protected.

Figure 3:
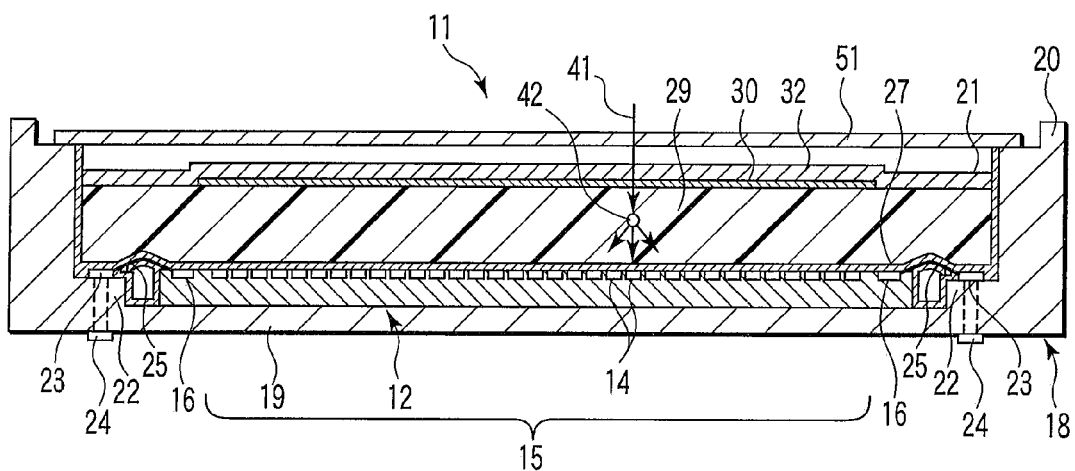
FIG. 3 is a cross-sectional view illustrating a radial ray detector according to a third embodiment of the present invention.
Figure 4:
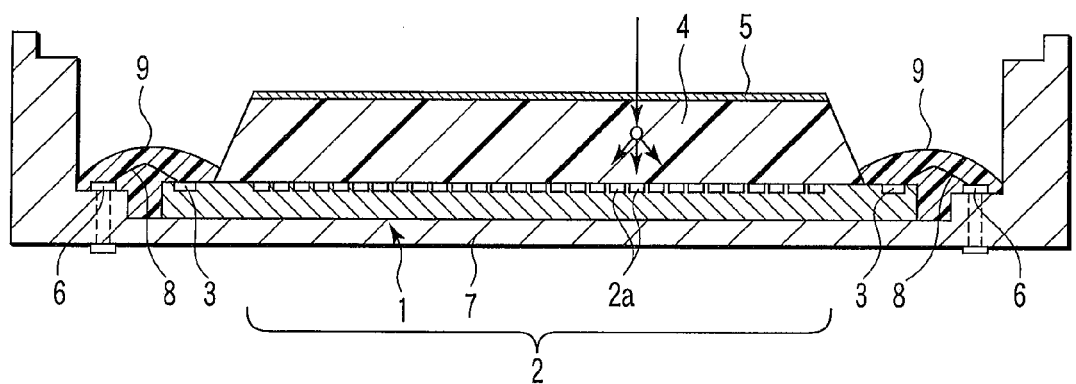
FIG. 4 is a cross-sectional view illustrating a conventional radial ray detector.

As shown in a third embodiment of FIG. 3, in addition to the protective layer 32 of the X-ray detector 11 in the first embodiment, the protective cover 51 which blocks the opening of the concave portion 21 of the base 18 is provided and the concave portion 21 is sealed, so that the scintillation layer 29 can be protected more reliably by a synergetic action of the protective layer 32 and the protective cover 51.

The X-ray detector 11 which detects the X-ray 41 has been described, but the present invention can be applied also to a radial ray detector which detects another radial rays.

The present invention is not limited to the above embodiments, and thus can be variously modified within a scope which does not deviate from the gist of the present invention.

According to the present invention, the light receiving section and the base-side electrode pads of the photoelectric conversion substrate, the base-side electrode pads and the interconnects arranged on the surface side of the base are coated with the protective layer integrally, and the scintillation layer is formed on the surface side of the protective layer. As a result, the protective layer can reliably protect the photoelectric conversion elements of the light receiving section, the electrode pads and the interconnects, and the light receiving section and the substrate-side electrode pads of the photoelectric conversion substrate can be arranged with a distance therebetween shortened, thereby miniaturizing the detector and enlarging the light receiving section.

What is claimed is:

1. A radial ray detector comprising:
a photoelectric conversion substrate which is provided with a light receiving section having a photoelectric conversion element on its surface side and a substrate-side electrode pad electrically connected to the photoelectric conversion element on an outer side of the light receiving section;
a base where the photoelectric conversion substrate is arranged on its surface side and a base-side electrode pad electrically connected to the substrate-side electrode pad of the photoelectric conversion substrate is arranged;
a wire which electrically connects the substrate-side electrode pad of the photoelectric conversion substrate and the base-side electrode pad of the base;
a protective layer formed, via a vapor growth method, on an entire inner surface on the base including at least the light receiving section, the substrate-side electrode pad of the photoelectric conversion substrate, the base-side electrode pad and the wire which are arranged on the surface side of the base, to coat the light receiving section and the substrate-side electrode pad, the base-side electrode pad and the wire sequentially and integrally; and
a scintillation layer contactingly formed on a surface of the protective layer by the vapor growth method, and covering all the light receiving section of the photoelectric conversion substrate, the substrate-side electrode pad, the base-side electrode pad, and the wire which are arranged on the surface side of the base,
wherein, the wire is held and secured to the scintillation layer via the protective layer.

2. The radial ray detector according to claim 1, wherein the protective layer has an insulation property, a vapor barrier property, a transmission property with respect to emission light of the scintillation layer, and corrosion resistance to a substance composing the scintillation layer.

3. The radial ray detector according to claim 1, wherein the protective layer is formed by an organic substance mainly containing polyparaxylylene.

4. The radial ray detector according to claim 1, wherein the protective layer is formed by an inorganic substance mainly containing carbon crystal.

5. The radial ray detector according to claim 1, wherein the scintillation layer is composed of a high-luminance fluorescent substance containing at least a halogen compound.

6. The radial ray detector according to claim 1, wherein the protective layer is about 1 μm in thickness.

7. The radial ray detector according to claim 1, wherein the protective layer is substantially flat over the surface of the photoelectric conversion substrate.

8. A method for manufacturing a radial ray detector, comprising:
arranging, on a surface side of a base, a photoelectric conversion substrate provided with a light receiving section having a photoelectric conversion element on its surface side and a substrate-side electrode pad electrically connected to the photoelectric conversion element on an outer side of the light receiving section;
electrically connecting the substrate-side electrode pad of the photoelectric conversion substrate with a base-side electrode pad arranged on the surface side of the base by a wire;
forming, via by a vapor growth method, a protective layer on an entire inner surface of the base including at least the light receiving section, the substrate-side electrode pad of the photoelectric conversion substrate, the base-side electrode pad and the wire, which are arranged on the surface side of the base, with a protective layer, and coating the light receiving section and the substrate-side electrode pad, the base-side electrode pad and the wire sequentially and integrally by the protective layer; and
contactingly forming a scintillation layer on a surface of the protective layer by the vapor growth method, the scintillation layer covering all the light receiving section of the photoelectric conversion substrate, the substrate-side electrode pad, the base-side electrode pad, and the wire which are arranged on the surface side of the base,
wherein, the wire is held and secured to the scintillation layer via the protective layer.

9. The method according to claim 8, wherein the protective layer is about 1 μm in thickness.

10. The method according to claim 8, wherein the protective layer is substantially flat over the surface of the photoelectric conversion substrate.

* * * * *